United States Patent [19]

Steffan et al.

[11] Patent Number: 5,946,213
[45] Date of Patent: *Aug. 31, 1999

[54] INTELLIGENT ADC RECLASSIFICATION OF PREVIOUSLY CLASSIFIED PROPAGATOR DEFECTS

[75] Inventors: Paul J. Steffan, Elk Grove; Ming Chun Chen, Milpitas, both of Calif.

[73] Assignee: Advanced Micro Devices, Inc., Sunnyvale, Calif.

[*] Notice: This patent is subject to a terminal disclaimer.

[21] Appl. No.: 08/955,774

[22] Filed: Oct. 22, 1997

[51] Int. Cl.$^6$ ...................................................... G06F 19/00
[52] U.S. Cl. ................................ 364/468.17; 364/468.28; 702/35
[58] Field of Search ..................... 364/468.17, 468.28, 364/488–494, 578; 702/35, 84, 185; 395/500; 438/14

[56] References Cited

U.S. PATENT DOCUMENTS

| | | | |
|---|---|---|---|
| 5,649,169 | 7/1997 | Berezin et al. | 395/500 |
| 5,761,064 | 6/1998 | La et al. | 364/468.17 |
| 5,777,901 | 7/1998 | Berezin et al. | 364/578 |
| 5,801,965 | 9/1998 | Takagi et al. | 702/35 |

Primary Examiner—William Grant
Assistant Examiner—Steven R. Garland
Attorney, Agent, or Firm—H. Donald Nelson

[57] ABSTRACT

A defect management system with a method to identify and reclassify previously classified propagator defects. The defect management system also has a method of identifying cluster defects and selecting at least one cluster defect to classify.

3 Claims, 4 Drawing Sheets

DEFECT MANAGEMENT SYSTEM

INTELLIGENT ADC RECLASSIFICATION OF PREVIOUSLY CLASSIFIED PROPAGATOR DEFECTS

BACKGROUND OF THE INVENTION

1. Cross Reference to Related Application

This application is related to Application, Ser. No. 08/955,773, filed on the filing date of this application, entitled AUTOMATIC DEFECT RECLASSIFICATION OF IDENTIFIED PROPAGATOR DEFECTS and is assigned to the assignee of this application.

2. Field of the Invention

This invention relates generally to a defect classification methodology in a semiconductor manufacturing testing system and more specifically, to an automatic defect classification methodology that reclassifies propagator defects using data obtained in a current layer and classifies at least one defect from each cluster.

3. Discussion of the Related Art

In order to remain competitive, a semiconductor manufacturer must continuously increase the performance of the semiconductor integrated circuits being manufactured and at the same time, reduce the cost of the semiconductor integrated circuits. Part of the increase in performance and the reduction in cost of the semiconductor integrated circuits is accomplished by shrinking the device dimensions and by increasing the number of circuits per unit area on an integrated circuit chip. Another part of reducing the cost of a semiconductor chip is to increase the yield. As is known in the semiconductor manufacturing art, the yield of chips (also known as die) from each wafer is not 100% because of defects during the manufacturing process. The number of good chips obtained from a wafer determines the yield. As can be appreciated, chips that must be discarded because of a defect or defects increases the cost of the remaining usable chips.

A single semiconductor chip can require numerous process steps such as oxidation, etching, metallization and wet chemical cleaning. Some of these process steps involve placing the wafer on which the semiconductor chips are being manufactured into different tools during the manufacturing process. The optimization of each of these process steps requires an understanding of a variety of chemical reactions and physical processes in order to produce high performance, high yield circuits. The ability to view and characterize the surface and interface layers of a semiconductor chip in terms of their morphology, chemical composition and distribution is an invaluable aid to those involved in research and development, process, problem solving, and failure analysis of integrated circuits.

Although it would be desirable to be able to identify and analyze each defect on each wafer in every manufacturing run it is not practical. In practice, a particular lot (a number of wafers) is selected to be representative of the manufacturing run. At least one wafer is selected from the lot to be analyzed. Because of the number of processes, it may not be possible to re-analyze each wafer after each process. Therefore, only certain processes may be selected to be analyzed. After each process that has been selected to be analyzed, the wafer is placed in an inspection tool that detects defects. As can be appreciated, there may be more defects than can be practically analyzed.

In the field of in-line defect detection and analysis there is a three-pronged focus of effort to try to explain the past (what has happened to the wafer), the present (what is happening to the wafer), and the future (what will happen to the wafer). Because of the number of defects that must be analyzed or accounted for, techniques have been developed to assist in the practical analysis of defects. One technique is called partitioning which is a technique where defects from the current layer of the wafer are mapped against defects from previous layers of the same wafer. Any defect from the current layer found within a certain radius of any previous layer defect is marked as a previous layer defect. The rationale for this is that the defects within a certain radius are the same defect. Because of this probability, only one of the previous layer defects within the selected radius is selected to be analyzed because to analyze further defects within the selected radius would be a waste of resources, time, and effort. The technique of partitioning separates previous layer defects from current layer defects, which are called "adders" and which are therefore eligible to be selected to be analyzed with the other defects in the current layer. Another technique to assist in the analysis of defects is the technique of declustering. Declustering is a technique in which all defects within a certain radius of each other are treated as a single defect, since it is probable that they were caused by the same event, such as a scratch, patch of residue, etc.

Presently, there is no method by which a detected defect in the present layer can be identified as a propagator and further, if it is a propagator, whether it will be a killer (die destructive) defect. Without such a method, a defect that may be a killer defect may be considered to be a benign defect. The early and proper classification and/or reclassification of possible killer defects is critical for any models or simulators, which will subsequently use this data for predicting or forecasting yields. In addition, it will place knowledge relating to the potential destructive nature of the defect in the hands of the process engineer so an intelligent decision can be made whether to scrap or send on wafers when dispositioning lots. In the present methodology, once a defect is classified, the defect is not reclassified and therefore, information concerning the characteristics of that defect in subsequent layers is not obtained. This information would be invaluable for the development of models that would predict at an early stage not only that a defect is a propagator defect but that the defect is going to be a killer defect. In addition, when a defect is characterized as a cluster defect all of the defects within that cluster are placed in the sample population. Therefore, the probability of one of the cluster defects being chosen to be classified depends upon the total number of defects that are detected on that particular layer.

Therefore, what is needed is a method to determine whether a defect is a propagator, whether it has been previously classified, and to reclassify the propagator defect. In addition, what is needed is a method to add at least one cluster defect to the number of defects that will be classified.

SUMMARY OF THE INVENTION

A defect management system in accordance with the present invention solves the above and other problems associated with the convention defect management systems.

The above and other objects and advantages of the present invention are attained by a mechanism that instead of eliminating all partitioned defects from the sample population when selecting defects for classification, the present invention removes only unclassified partitioned defects and uses the classification information from previous layers to predict the current level defect more accurately. The present invention serves to reclassify selected previously classified defects.

The present invention determines whether defects observed in a current layer are propagator defects and if so if they have been previously classified. If they have been previously classified, they are reclassified. The database is updated with the reclassification data. In addition, cluster defects are determined and at least one cluster defect is selected to be classified.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiments when read in conjunction with the accompanying drawings, wherein:

DETAILED DESCRIPTION

Reference is now made in detail to specific embodiments of the present invention which illustrate the best mode presently contemplated by the inventors for practicing the invention.

Figure 1:
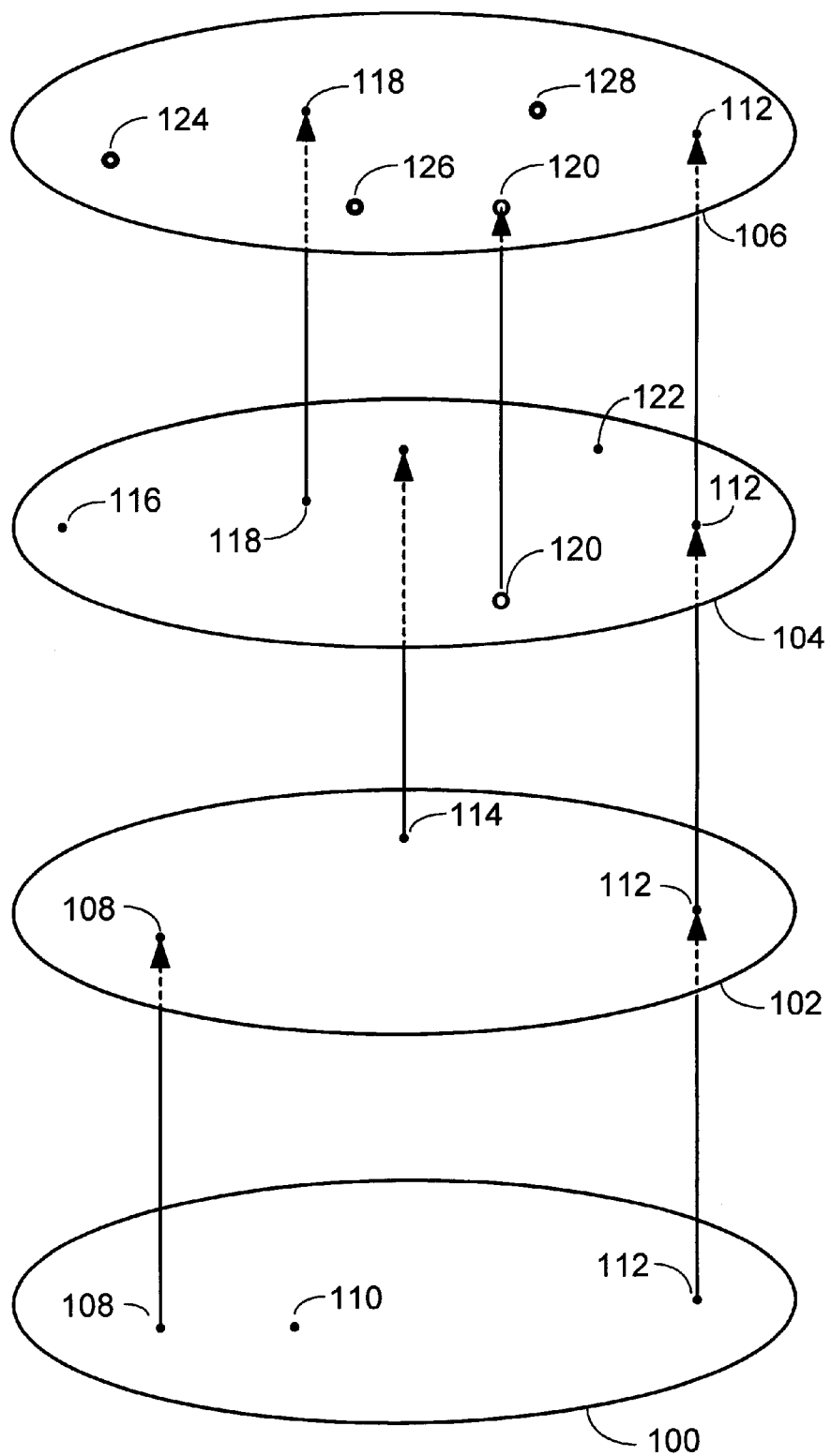
FIG. 1 is an overview of the process of inspecting layers and illustrates adder defect and propagator defects.

Referring to FIG. 1 there is shown an overview of the process of inspecting individual layers in a process for the manufacture of semiconductors. A semiconductor wafer with a first process layer is represented by 100. The semiconductor wafer with a second process layer is represented by 102, the semiconductor wafer with a third process layer is represented by 104, and the semiconductor wafer with a fourth process layer is represented by 106. The semiconductor wafer with a first process layer 100 shows three defects 108, 110, and 112 that have been observed. Because this is the first layer on which defects 108, 110, and 112 have been observed they are termed "adder" defects. Adder defects are defined as those defects that are observed at the current layer that were not observed at an inspection of any previous layer. The semiconductor wafer with a second process layer 102 is shown with defect 108 observed on the second layer and is therefore a "propagator" defect. A propagator defect is defined as a defect observed at the current layer which, when mapped against defects observed at a subsequent layer is found to be within a certain radius of the subsequently observed defect. Therefore, it can be appreciated that in addition to defect 108 being a propagator defect, defect 112 is also a propagator defect. Defect 114 is an adder defect since it was first observed on the second layer 102. The semiconductor wafer with a third process layer 104 shows four adder defects 116, 118, 120 and 122. The semiconductor wafer with a third process layer also shows the propagator defects 112 and 114. The semiconductor wafer with a fourth process layer 106 is shown with three adder defects 124, 126, and 128. The semiconductor wafer with a fourth process layer 106 also shows the propagator defects 118, 120, and 112.

Figure 2:
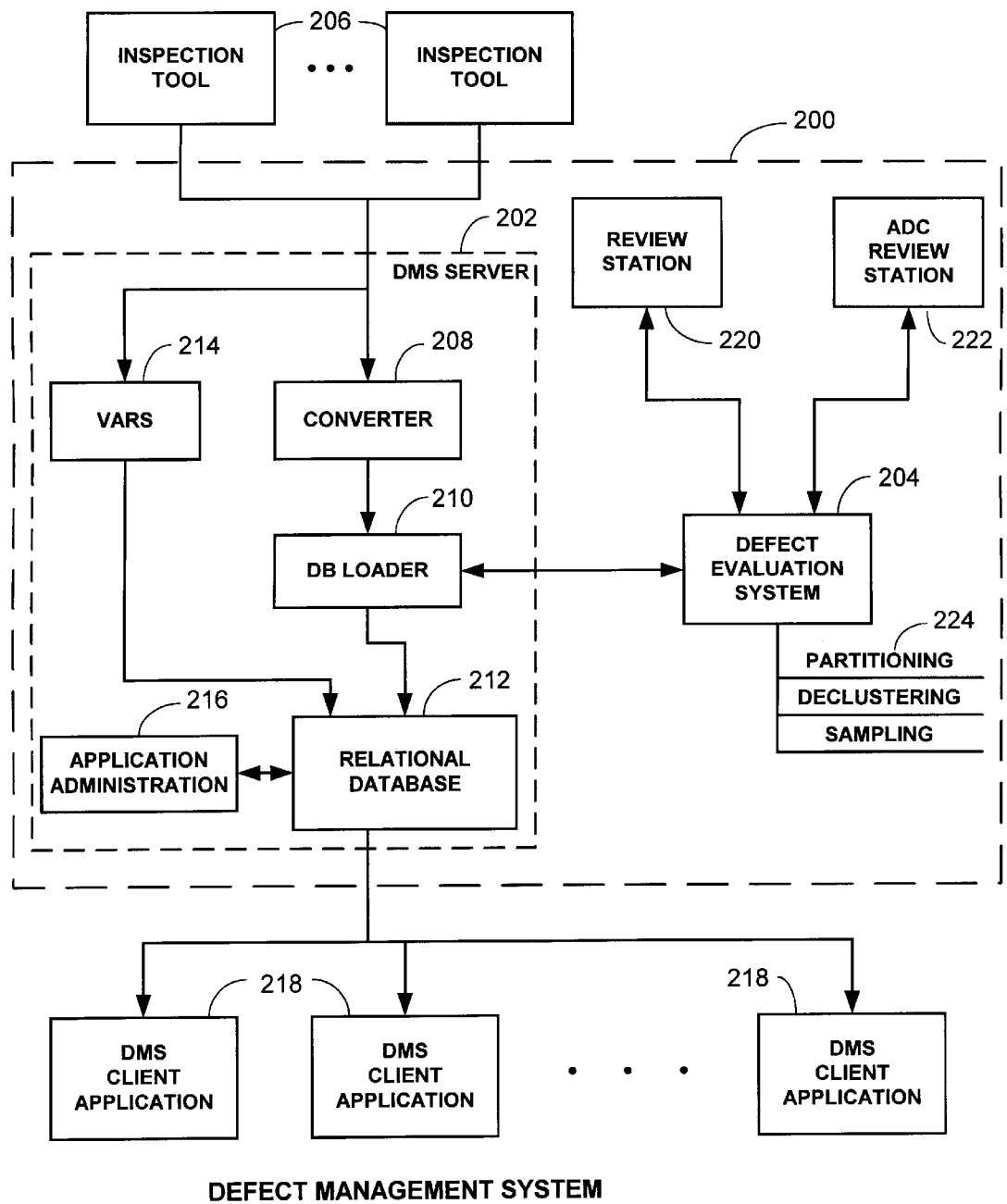
FIG. 2 is an overview of the defect management system (DMS)

Referring to FIG. 2 there is shown an overview of a DMS (Defect Management System) 200 that is used to detect and analyze defects in the manufacturing process for the fabrication of semiconductor wafers. As discussed above, a wafer from a production lot is selected to be analyzed. It is noted that more than one wafer can be selected, however, the following discussion will be directed to the situation when only one wafer is selected to be analyzed and it should be appreciated that the discussion will be applicable to other wafers that may be chosen. In any analysis situation, the same wafer is analyzed after each process step that is selected to be analyzed. It should also be noted that it may be the situation that the wafer is not analyzed after each process step, that is, only certain process steps will be analyzed. The defect management system 200 has a DMS server section 202 and a DES (defect evaluation system) section 204. The DMS server 202 receives input from a variety of inspection tools, indicated at 206. These inspection tools are known as scanners and can be from different vendors. Typically, each inspection tool has its own file format for data that is converted to a common file format by converter 208. The converted data is sent to a database loader 210. The scanned data that is input to the database loader 210 consists of scan data collected by the scanner such as location of the defects, size of the defects and other characteristics determinable by the scanner such as reflectance. The database loader 210 loads the scan data for each defect into the relational database 212 where a database file is built for each defect. The data from the inspection tools 206 is also sent to a VARS (Video Archival and Retrieval System) 214 which captures the visual aspects of each defect. The video data is sent by the VARS 214 to the relational database 212 where it is attached to the file for the respective defect. The relational database 212 has an application administration 216 associated with it by which the relational database can be updated and modified by a database administrator. The data in the relational database 212 can be accessed by DMS client application computers, indicated at 218, where the data, including the video data, can be reviewed and analyzed.

The database loader 210 also sends the converted data received from the inspection tools 206 via the converter 208 to the DES (Defect Evaluation System) 204. The data received by the DES 204 is sent to a review station 220 where a trained human operator assigns a code number to each defect. The code number assigned to each defect serves to categorize the defect. The data received by the DES 204 is also sent to an ADC (Automatic Defect Classification) review station 222 that assigns a further classification code to each defect based upon a set of predicate values based upon various characteristics of the defect, such as roundness, brightness, etc. The DES 204 also determines whether the data for a defect is to be partitioned, declustered, or sampled as indicated at 224.

Figure 3:
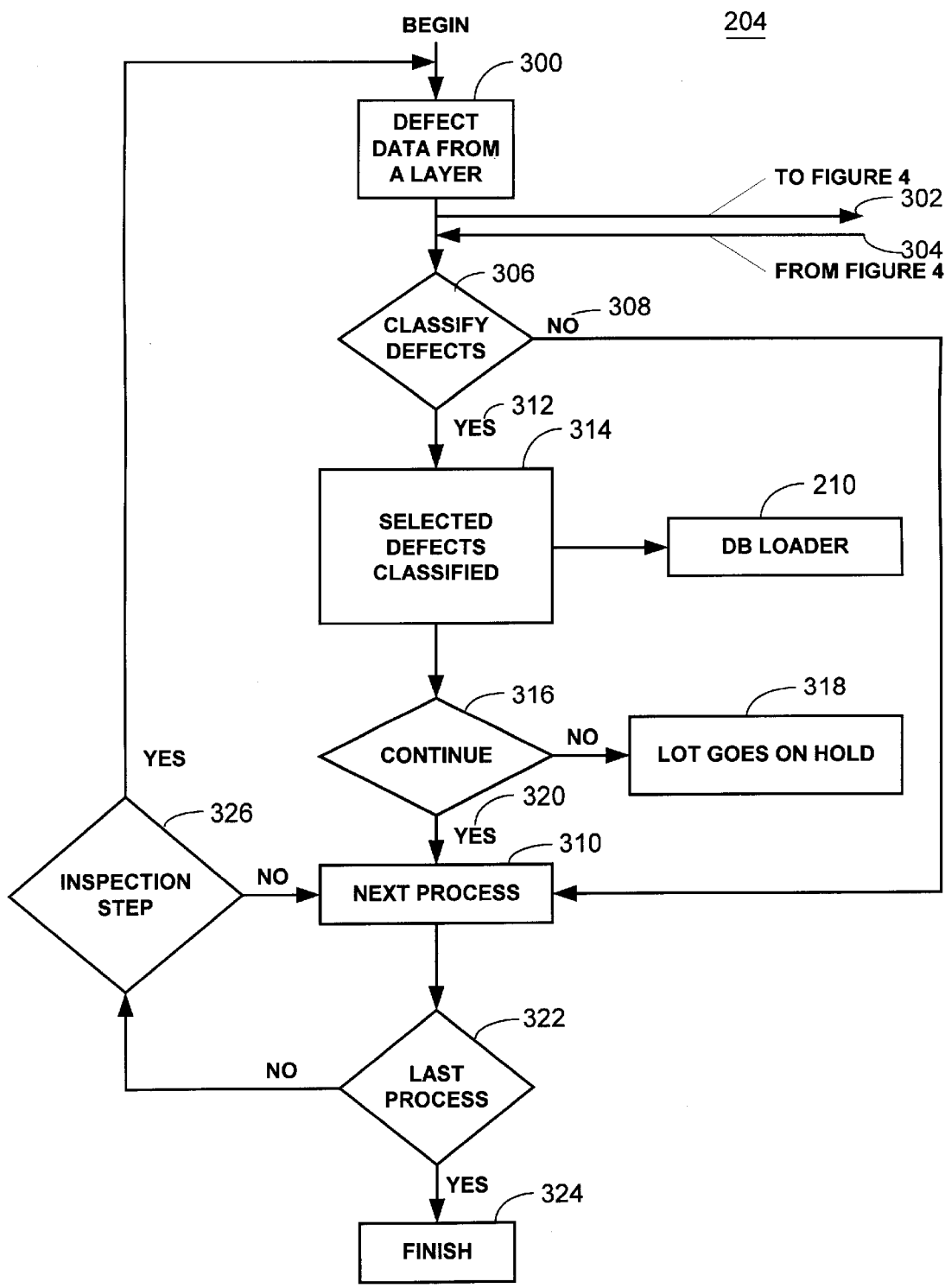
FIG. 3 is an overview of the defect evaluation system (DES)
Figure 4:
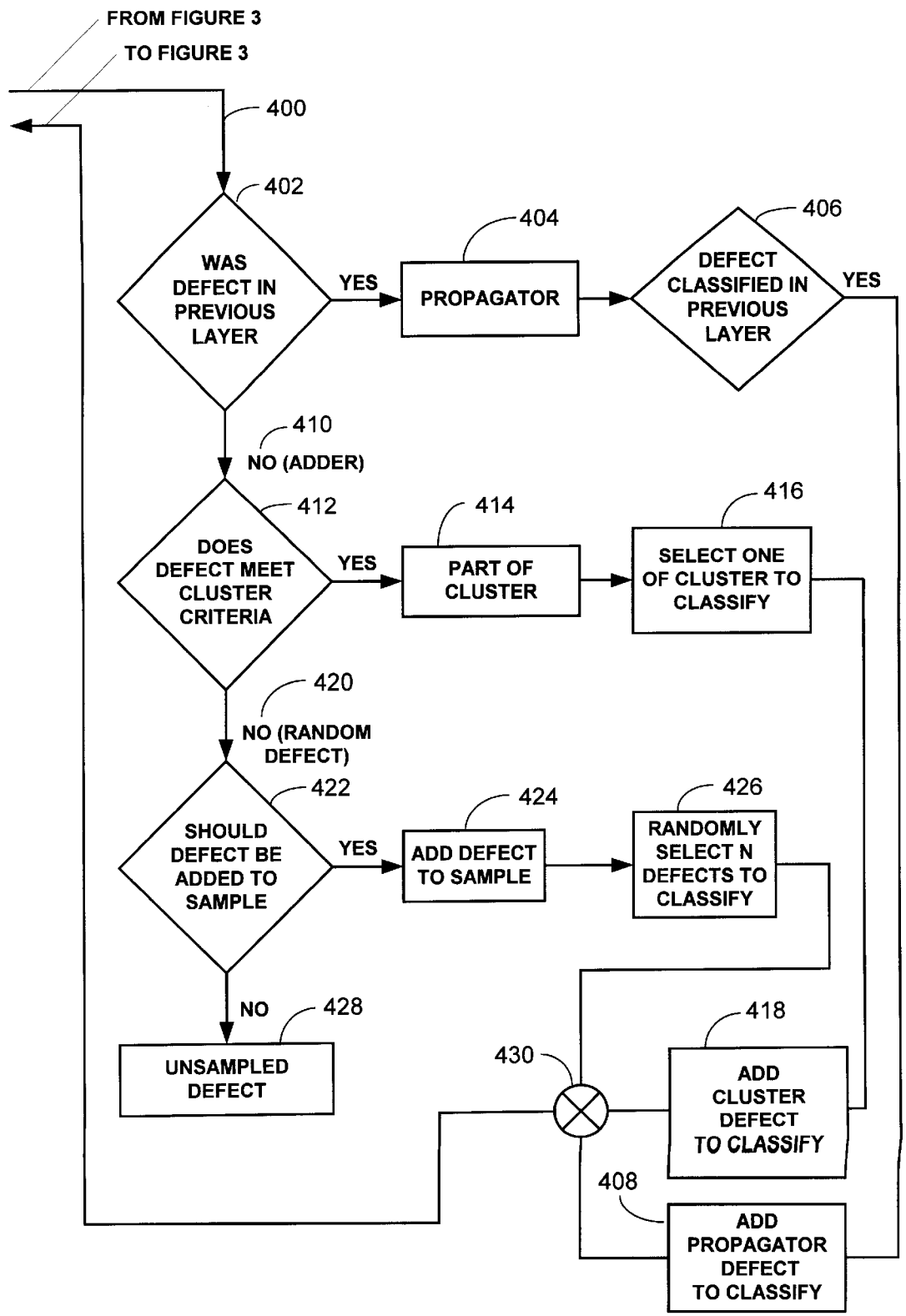
FIG. 4 shows the partitioning, declustering and sampling methodology of the defect evaluation system.

Referring to FIG. 3, there is shown a flow diagram of the operation of the DES 204. The operation of the DES 204 begins when the DES 204 receives defect data from a layer, indicated at 300. The defect data is sent to FIG. 4, indicated at 302, and will be discussed below. The defect data is returned from FIG. 4, indicated at 304, and will also be discussed below. The defect data at 300 as well as defect data from FIG. 4 is received at a decision point 306 where a decision is made as to whether the defects should be classified. The decision is based on various criteria including whether there are enough defects to classify and whether any valuable and meaningful information could be gained by classifying the defects. If the decision is NO, as indicated at 308 the flow jumps to the next process 310. If the decision is YES, as indicated at 312, the selected defects are classified, as indicated at 314. The decision as to which defects are selected is made with information determined by FIG. 4 and will be discussed below. The defect classification is sent to the database loader 210 (FIG. 2), which sends the data to the relational database 212 (FIG. 2) where the data relating to each defect is updated. Depending upon the defect classification data at 314, a decision whether to continue is made at 316. The decision whether to continue includes criteria such as the number of defects found, for example, if there are too many defects the yield for the production lot may be too low and it would not be cost effective to continue processing the production lot. Another criteria would include whether the classified defects are the type of defects that are determined to be "killer" defects and the yield would be too low in this case also. In the event the decision is made that it would not be cost effective to continue, the production lot is put on hold, as indicated at 318 until the cause of the defects can be determined. If the decision is made to continue, as indicated at 320, the wafer is sent to the next process, indicated at 310. A determination is made at 322 as to whether the "next process" is the last process and if so the wafer is finished, indicated at 324. If the process is not the last process, the next step is to determine if the next process is a layer in which there is going to be an inspection step performed on the layer after the process step is performed, as indicated at 326. If YES, the process begins again at 300, if NO the wafer is sent to the next process 310.

Referring to FIG. 4 there is shown the flow diagram of the methodology of partitioning, declustering, and sampling according to the present invention. The defect data from a layer is received from FIG. 3 at 400. The first step, known as partitioning, is to determine if the defect is a propagator defect at 402 by determining if the defect was in any previous layers. If YES, the defect is considered a propagator, as indicated at 404. A determination is made at 406 whether the propagator was classified when detected in a previous layer. If YES, the defect is added to the defects that will be classified for the current layer, as indicated at 408. If it is determined that the defect is not a propagator, the defect is considered an adder, indicated at 410. The next decision is whether the defect meets the criteria of being in a cluster, indicated at 412. The definition of a cluster includes a group of defects within a critical radius or defects in a relationship that would indicate an effect such as a scratch. If it is determined that the defect meets the criteria of being in a cluster, the defect is classified as being part of a cluster, at 414. One defect within the cluster is selected to be added to the defects that will be classified in the current layer, as indicated at 416. The selected cluster defect is added to the defects to be classified, as indicated at 418. If the defect is not determined to be part of a cluster, the defect is considered a random defect, indicated at 420. The next decision is whether the defect should be added to the sample population from which the defects to classify is chosen, as indicated at 422. If YES, the defect is added to the sample population, as indicated at 424. There are N defects randomly selected to be classified, indicated at 426, and the information is sent back to the classify defects decision 306 (FIG. 3). If NO, the defect is not added to the sample population, as indicated at 428. The total number of defects that will be classified in the current layer is then N+ the number of propagator defects that were previously classified and one defect from each cluster of defects. The addition is indicated at 430.

The benefits of the present invention include:

1. Allowing the full use of all information available to make more intelligent and accurate reclassifications.

2. Provides the most accurate "historical" information for previous layers.

3. Provides a mechanism for further classifying and characterizing propagating defects.

4. Allows more thorough training for operators.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of updating a database in a defect management system, the method comprising:

obtaining at least one layer data concerning defects observed on the least one layer manufactured on a semiconductor substrate;

loading the at least one layer data into a database;

obtaining subsequent layer data concerning defects observed on a subsequent layer manufactured on the semiconductor substrate;

loading the subsequent layer data into the database;

determining whether the subsequent layer data includes data concerning defects observed in the at least one layer, wherein the defects are then identified as propagator defects;

determining whether the identified propagator defects have been previously classified; and reclassifying the previously classified propagator defects.

2. The method of claim 1 further identifying defects that are cluster defects and selecting one of the identified cluster defects to classify.

3. The method of claim 2 further comprising randomly selecting n defects to classify.

* * * * *